(12) United States Patent
Unterleitner

(10) Patent No.: US 7,485,947 B2
(45) Date of Patent: Feb. 3, 2009

(54) ZENER DIODE AND METHOD FOR PRODUCTION THEREOF

(75) Inventor: Franz Unterleitner, Kalsdorf (AT)

(73) Assignee: Austriamicrosystems AG, Unterpremstatten (AT)

( * ) Notice: Subject to any disclaimer, the term of this patent is extended or adjusted under 35 U.S.C. 154(b) by 41 days.

(21) Appl. No.: 10/499,262

(22) PCT Filed: Dec. 12, 2002

(86) PCT No.: PCT/EP02/14174

§ 371 (c)(1),
(2), (4) Date: May 10, 2005

(87) PCT Pub. No.: WO03/054971

PCT Pub. Date: Jul. 3, 2003

(65) Prior Publication Data

US 2005/0212086 A1 Sep. 29, 2005

(30) Foreign Application Priority Data

Dec. 21, 2001 (DE) ................. 101 63 484

(51) Int. Cl.
*H01L 29/72* (2006.01)
(52) U.S. Cl. ............ 257/603; 257/605; 257/401; 257/618; 438/81; 438/380; 438/545
(58) Field of Classification Search ........... 257/565, 257/401, 603, 605, 618; 438/81, 380, 545
See application file for complete search history.

(56) References Cited

U.S. PATENT DOCUMENTS

| 4,589,002 A | * | 5/1986 | Olmstead .................. 257/605 |
| 4,590,664 A | | 5/1986 | Prentice et al. |
| 4,646,114 A | | 2/1987 | Vinn et al. |
| 4,672,403 A | * | 6/1987 | Jennings .................. 257/606 |
| 5,852,323 A | | 12/1998 | Conn |
| 5,936,288 A | * | 8/1999 | Tsuchida et al. ............ 257/370 |
| 5,990,534 A | | 11/1999 | Tsuji |

FOREIGN PATENT DOCUMENTS

| EP | 0 054 740 | | 11/1981 |
| EP | 0 054 740 | * | 6/1982 |
| EP | 0 595 629 | | 10/1993 |
| EP | 0 612 109 | | 1/1994 |
| EP | 0 883 193 | | 12/1998 |
| JP | 58063176 | | 4/1983 |
| JP | 62145879 | | 6/1987 |

OTHER PUBLICATIONS

International Preliminary Examination Report—Application No. PCT/EP2002/014174, dated Aug. 26, 2004.

* cited by examiner

*Primary Examiner*—Edward Wojciechowicz
(74) *Attorney, Agent, or Firm*—Fish & Richardson P.C.

(57) ABSTRACT

A zener diode circuit includes a semiconductor substrate having an N-doped region and a P-doped region that form a PN junction. The N-doped region and the P-doped region have areas with widths that decrease as the N-doped region and the P-doped region approach the PN junction. The zener diode circuit also includes a transistor that provides current to the zener diode, and circuitry that detects a state of the zener diode.

21 Claims, 3 Drawing Sheets

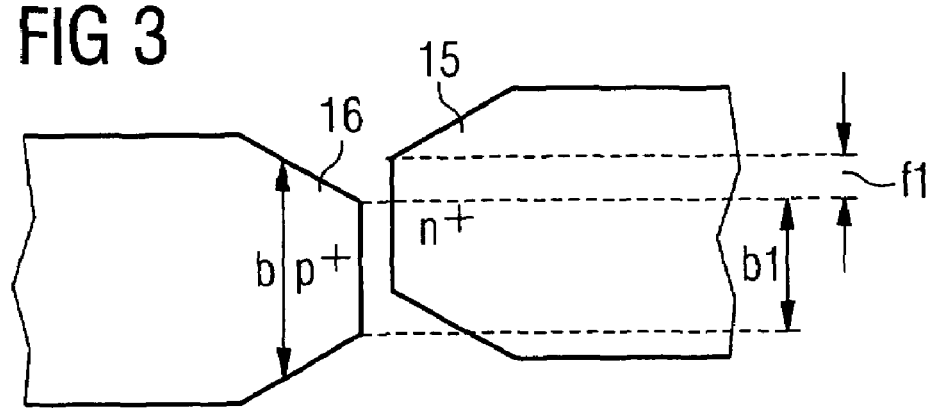
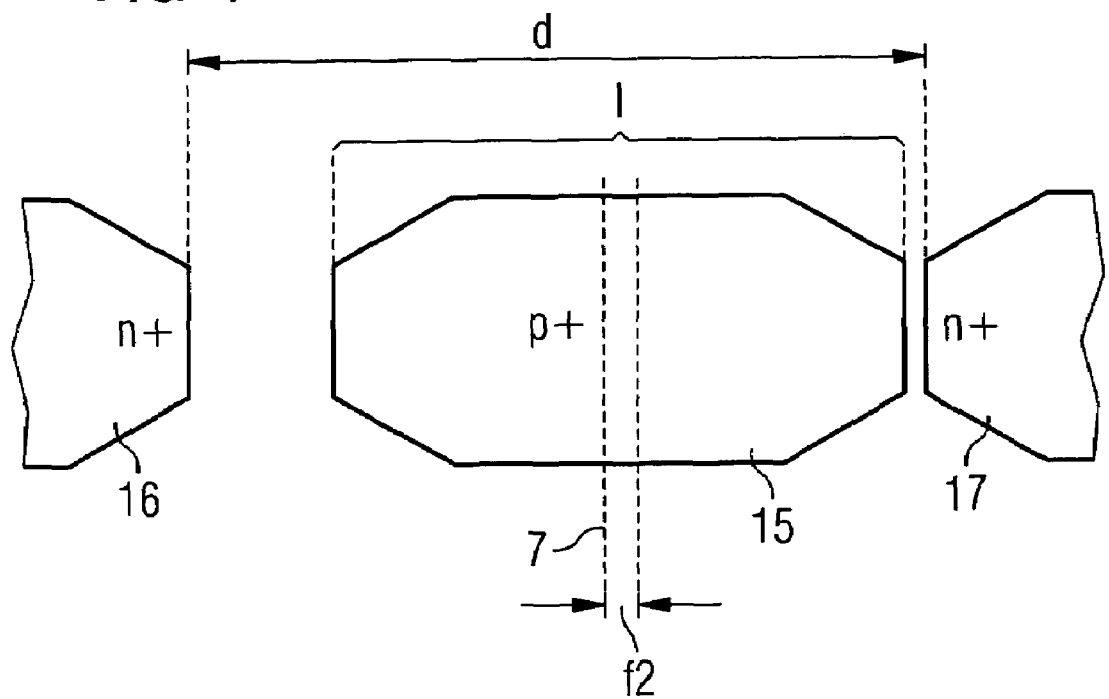

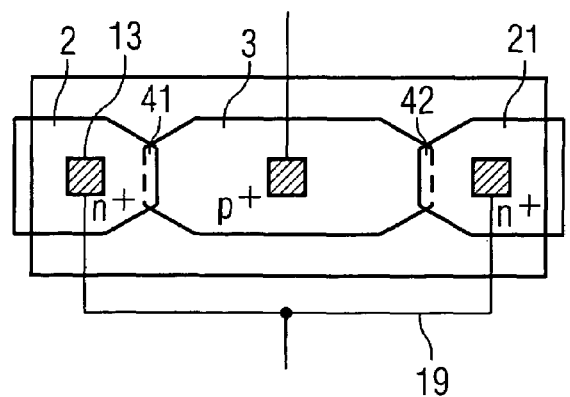
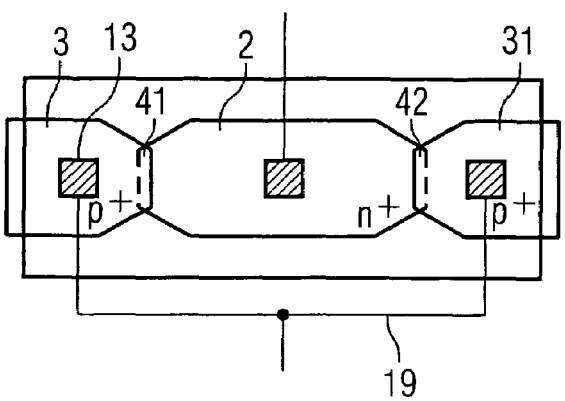
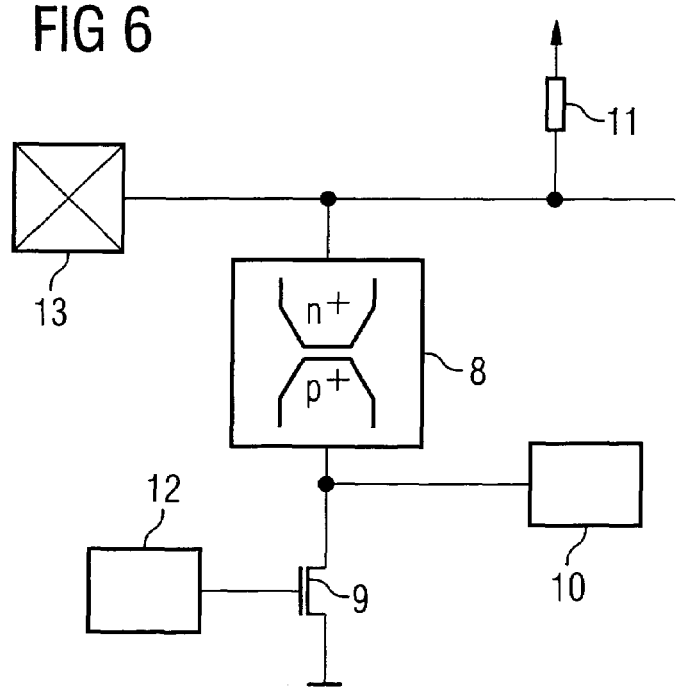

ZENER DIODE AND METHOD FOR PRODUCTION THEREOF

TECHNICAL FIELD

This patent application relates to a Zener diode having a semiconductor substrate having an N-doped region and a P-doped region, and in which the doped regions form a PN junction. This patent application also relates to a circuit including the Zener diode and to a method for manufacturing the Zener diode.

BACKGROUND

Zener diodes are known from publication U.S. Pat. No. 5,990,534, which have a PN junction arranged perpendicularly in a semiconductor substrate. A PN junction of this type has the disadvantage that it cannot be manufactured for integrated circuits using standard manufacturing methods because of varying depths of penetration required. Furthermore, known Zener diodes are not suitable as a PROM component, because their PN junctions have a relatively large surface and accordingly, a higher current would be necessary to burn through the PN junction.

Zener diodes are also known from publication U.S. Pat. No. 4,672,403, in which the PN junction is a lateral junction. The N-region is designed in the form of a point. Such a point makes it possible to concentrate currents flowing through the diode readily, for which reason a low current is required to burn through such a diode. However, such a known diode also has the disadvantage that it cannot be manufactured for integrated circuits using standard manufacturing methods because of varying depths of penetration required.

Zener diodes are used for PROM components. The Zener diode is burned through by an adequately high current or it is also shorted, which gives rise to a resistor instead of the Zener diode. The Zener diodes are loaded in the reverse direction during the burn-though.

Furthermore, known Zener diodes have the disadvantage that the overlap of the P-doped and N-doped region is relatively large, causing leakage currents of the Zener diodes to be high.

SUMMARY

A Zener diode is described herein, which has a semiconductor substrate. Located in the semiconductor substrate are N-doped and P-doped regions. Two of the doped regions form a lateral PN junction. The mutually facing sides of the doped regions have a width that diminishes toward the other doped region.

Such a Zener diode has the advantage that based on the diminishing width, the actual PN junction is relatively small, for which reason such a diode has a low leakage current. Low leakage currents are advantageous because for one thing, they make it possible to reduce the total current consumption of a circuit and, when used as a programmable element, the difference between the programmed state (low resistivity, high flow of current) and the unburned state (high resistivity, very low leakage current) is more distinct and therefore offers increased certainty of differentiation.

Furthermore, such Zener diodes have the advantage that because of the diminishing width of the doped regions, it is possible to concentrate a current flowing through the diode spatially to the junction between the two regions, resulting in an advantageous localization of the thermal energy produced by the current in the component. This makes it possible to use a relatively low current to achieve a burn-through of the diode in order to store data.

The mutually facing ends of the doped regions may have a minimum width. Accordingly, the doped regions have outlines in the form of trapezoids facing one another. These trapezoids originate from triangular regions, where points of triangles facing one another are flattened. Minimum widths at the ends of the doped regions may make it possible that, in the event of an alignment error of the masks used for the production of the doped region, the doped regions may still overlap in contrast to pointed ends of the doped regions, and thus it may still be possible to achieve a functioning PN junction. The minimum widths at the ends of the doped regions also make it possible to compensate for an alignment error in the production of the doped regions.

The ends of the doped regions may, for example, be defined by straight edges.

Furthermore, a Zener diode is described herein, which has an additional P-doped region. A Zener diode may also have an additional N-doped region. The N-doped region is situated between two P-doped regions. However, the P-doped region may also be situated between two N-doped regions. The N-doped region forms a lateral PN junction with each of the adjacent P-doped regions. In the same way, the N-doped region forms a lateral PN junction with each of the adjacent P-doped regions. In such a Zener diode, the two PN junctions may be connected in parallel. To that end, the P-doped regions are connected to a first external terminal and the N-doped regions are connected to a second external terminal. This results in a double Zener diode, which has properties similar to a single Zener diode. In particular, such a double Zener diode may be programmed by a current.

Double Zener diodes have the advantage that it is possible to compensate for alignment errors of masks used for manufacturing the diodes. A doped region lying between the two outer doped regions may migrate between the two outer regions within limits established by the precision of adjustment. It may lie closer to the one or the other of the doped regions. Because the other geometric variables are constant, the sum of the distances between the central doped region and the first outer doped region as well as between the central doped region and the other outer doped region is constant. A greater distance on the one side is compensated by a smaller distance on the other side. As a result, alignment errors may be compensated for within specific constraints defined by the technology.

In a Zener diode, all doped regions may also be situated within a single opening of a diffusion mask. Normally, field oxide masks of $SiO_2$ are used as diffusion masks. The placement of all doped regions in a single opening of a diffusion mask has the advantage that is not possible for other errors in the Zener diode to occur due to errors in the alignment of the diffusion mask.

The N-doped and P-doped regions may be designed so that each is symmetrical to a plane perpendicular to the substrate surface. Such symmetry simplifies the production of the doped regions, for one thing, because it is possible to reproduce structures once produced by reflection. Furthermore, the symmetrical design of the doped regions has the advantage that in the case of double Zener diode, an even improved compensation for alignment errors along the connection axis of the outer doped regions is possible.

The dopes regions may be doped P+ or N+. This increases the number of charge carriers in the particular doped regions, resulting in improved conductivity.

In order to form a PN junction, the P-doped and N-doped regions may overlap.

The Zener diode or the doped regions of the Zener diode may be produced using photolithographic masks. The minimum width may be adapted to the maximum expected alignment error of the masks with one another, in the direction of the width of the doped regions. In this regard, it is advantageous if the minimum width of the doped regions is greater than the alignment error to be expected in this direction. It is thus possible to ensure that even with maximum alignment error, the two doped regions overlap, making it possible to ensure a functioning diode.

In a similar manner, in a double Zener diode, it is possible to adapt a distance between the outer doped regions, i.e., the distance between those doped regions having the same doping polarity, to the maximum alignment error to be expected in the direction of the connection between the outer doped regions. This adaptation is performed in connection with the extension of the intermediate doped region. Overall, it must be ensured that, even with a maximum alignment error, a functioning PN junction will be produced. To that end, the distance of the outer doped regions or the size of the inner doped region must be selected in such a way that the size of the inner doped region, together with the maximum alignment error, produces roughly the distance of the two outer doped regions from one another.

A Zener diode circuit is described herein, in which the Zener diode is connected with means for impressing an electric current and in which the Zener diode is connected to means for reading out the condition of the Zener diode.

This makes it possible to program the Zener diode using a programmable current. This means that the Zener diode is changed from a condition before burn-through into a condition after burn-through, i.e., into a condition having resistance. This condition may now be read out to determine the programming state of the Zener diode.

Furthermore, a method for manufacturing a Zener diode is described herein, in which photolithography is used to create two masks on a semiconductor substrate. Such masks may be created, for example, by structuring a photoresist. The photoresist may be structured optically, for example, by using light. The first mask has a first opening on the substrate surface. The second mask has a second opening on the substrate surface. The width of the openings diminishes on the sides facing one another and diminishes to a finite minimum width. The minimum width must be adapted to the maximum expected alignment error of the openings with one another. The substrate is N-doped or P-doped below the first opening. Below the second opening, the substrate is doped with a doping opposite to the first opening. For example, the second substrate is P-doped below the second opening. Moreover, the following operations are performed:

a) Production of the first mask,
b) Alignment of the second mask relative to the first mask,
c) Production of the second mask.

The method has the advantage that the geometric design of the masks corresponding to the procedural method makes it possible to compensate for alignment errors of the masks in relation to one another.

Furthermore, a method for manufacturing a Zener diode is described herein, in which photolithography is used to create two masks on a surface of a semiconductor substrate, and in which a first mask has a first opening on the surface of the semiconductor substrate. The second mask has two additional openings on the surface of the semiconductor substrate. The first opening is positioned between the two additional ones. The width of the openings diminishes on the sides facing one another and diminishes to a finite minimum width. The minimum width is adapted to the maximum expected alignment error of the masks in relation to one another in the direction of the width. The semiconductor substrate is N-doped or P-doped below the first opening. Below the two other openings, the semiconductor substrate is doped with an opposite doping, i.e., P-doping or N-doping. Moreover, the following steps are performed:

a) Production of the first mask,
b) Alignment of the second mask relative to the first mask,
c) Production of the second mask The method for producing the Zener diode has the advantage that it is even possible to compensate for alignment errors perpendicular to the width of the openings. This is successful, in particular, if the distance between the second openings and the length of the first opening between the second openings is adapted in such a way that the expected alignment error is less than the distance between the two outer openings minus the length of the center opening. Such a geometric design of the openings ensures that at least one functioning Zener diode is manufactured in any case.

DESCRIPTION OF THE DRAWINGS

FIG. 3 shows an exemplary schematic top view of an alignment error of two masks for manufacturing the Zener diode.

FIG. 4 shows an exemplary schematic top view of the alignment error of two masks in the manufacture of a double Zener diode.

FIGS. 5A and 5B show an exemplary top view of double Zener diodes.

FIG. 6 shows an exemplary schematic block diagram of a Zener diode circuit.

DETAILED DESCRIPTION

Figure 1:
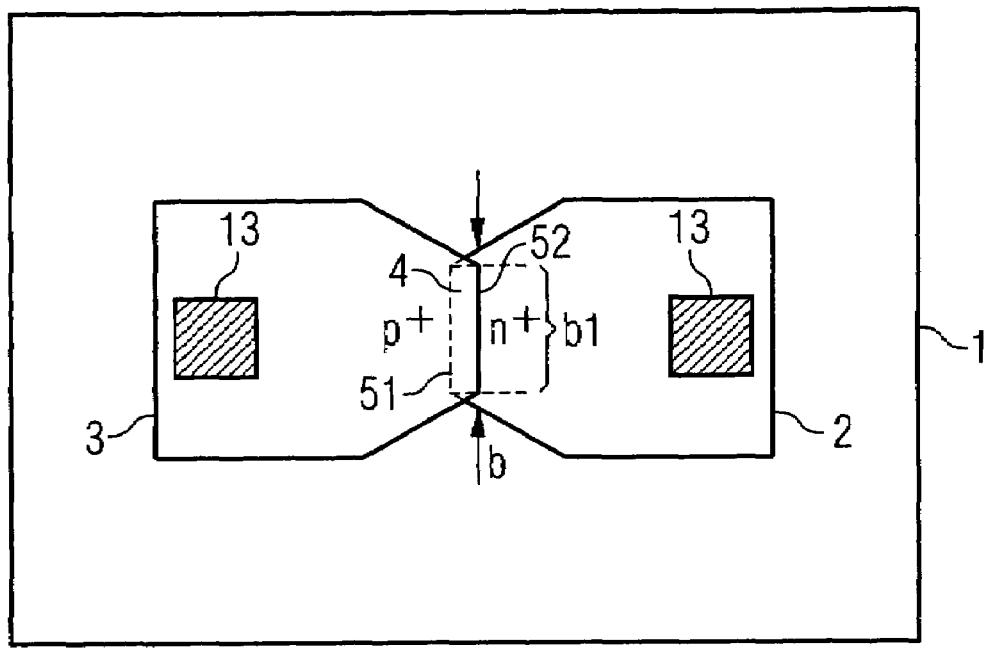
FIG. 1 shows an exemplary schematic top view of a Zener diode.

FIG. 1 shows a semiconductor substrate 1, which has an N-doped region 2 and a P-doped region 3. Each of doped regions 2, 3 is provided with a contact surface 13, which makes them electrically bondable. The semiconductor substrate may be, for example, a silicon substrate. Doped regions 2, 3 may be, for example, situated in an N-well or even in a P-well. The N-doped region has N+ doping. The P-doped region has P+ doping. Doped regions 2, 3 overlap after the completion of the manufacturing process and form a PN junction 4 in the overlap area. At their mutually facing ends, doped regions 2, 3 have a width b, which diminishes toward the particular other doped region 2, 3. Doped regions 2, 3 come together at a point. However, their mutually facing ends do not have points but instead, their mutually facing ends are defined by straight edges 51, 52. Doped regions 2, 3 thus have flattened points. Advantageously they may have a trapezoidal shape. Minimum width b1 of doped regions 2, 3 at the mutually facing ends is selected in such a way that it is adapted to the maximum expected alignment error (see also FIG. 3 in this regard). Due to the diminishing width, the doped regions and the Zener diode formed from them have the advantage that it is possible to concentrate a current used for programming the Zener diode spatially, making it possible to keep the current required for the burn-through of the diode relatively low. Cutting off the points of the doped regions makes it possible to compensate for alignment errors.

The layout drawing of the mask openings usually contains a bias, which is an intentional reduction or enlargement compared to the intended final size of the opening. It is intended to counteract displacements of the opening boundaries (by photoresist exposure and development, lateral outward diffusion), which are already known in the manufacturing method. It is therefore normally the case that the drawing of the P and N regions does not show the final distance of the two regions. However, all of these effects must already be considered in the drawing in order to guarantee an optimum functioning of the element. There are therefore production processes in which the drawings of the P and N regions already overlap (as shown, for example, in FIG. 1).

The doped regions may have dimensions from 1 to 10 μm.

Figure 2:
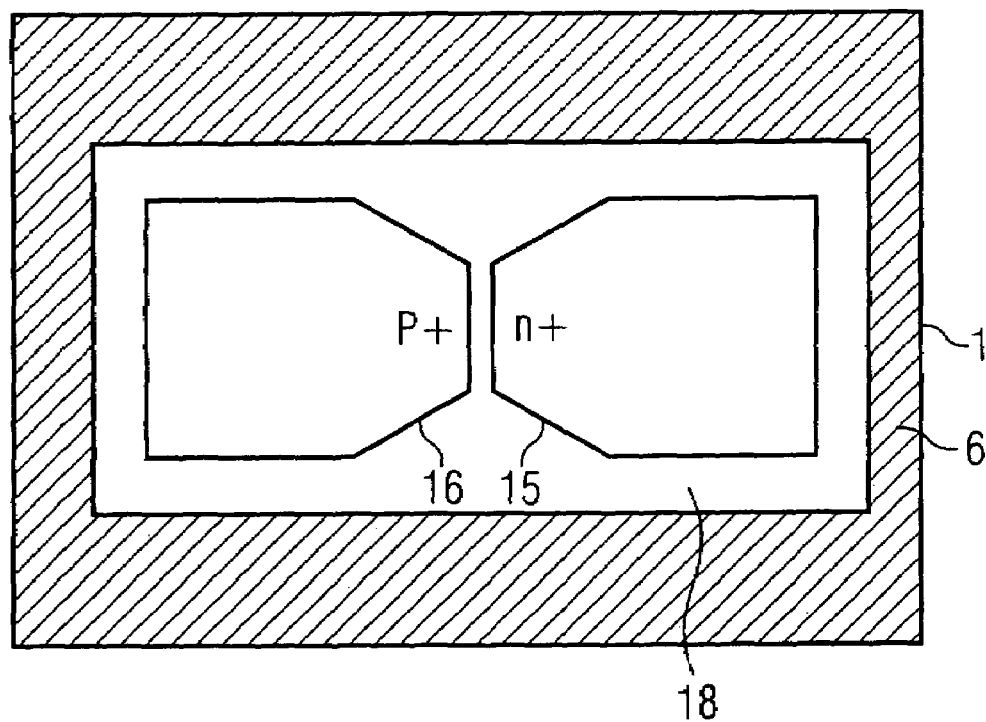
FIG. 2 shows an exemplary schematic top view of the system of two masks for manufacturing a Zener diode.

FIG. 2 shows a semiconductor substrate 1 having a diffusion mask 6, which may be, for example, a field oxide ($SiO_2$). Diffusion mask 6 has an opening 18, in which two additional openings 15, 16 are situated. These openings 15, 16 are associated with masks used to structure the Zener diode. Semiconductor substrate 1 is N+ doped below first opening 15. Semiconductor substrate 1 is P+ doped below second opening 16. It must be noted that the shape of openings 15, 16 does not necessarily coincide with the outlines of doped regions 2, 3 because, for example, beam divergence or diffusion processes occurring after doping may result in changes in the shape of doped regions 2, 3. What was stated for doped regions 2, 3 with respect to the shape of the mutually facing ends and with respect to the width or minimum width b1 also applies to openings 15, 16 of two different masks, which are used for manufacturing the Zener diode.

The doping in openings 15, 16 may, for example, be the result of ion implantation or even diffusion.

FIG. 3 shows two openings 15, 16 opening 15 being associated with a first mask and opening 16 with a second mask. The two masks should be aligned in relation to one another.

In the direction of diminishing width b or in the direction of minimum width b1, the device used to align the masks, an exposure machine, for example, has a maximum alignment error f1. An appropriate selection of minimum widths b1 of openings 15, 16 makes it possible to compensate for such a maximum alignment error f1 in such a way that even with a maximum alignment error, the doped regions produced by openings 15, 16 overlap, and consequently a Zener diode is formed. For this purpose, it is necessary that:

$b1 > f1.$

FIG. 4 shows the production of a Zener diode using a first mask having an opening 15. A second mask has openings 16, 17 on the surface of a silicon substrate. Openings 15 or 16 and 17 are designed to have mirror symmetry to a vertical plane.

According to FIG. 4, the following is true of the maximum expected alignment error f2 in the direction of the connection between openings 16, 17:

$d - 1 \geq f2.$

In this arrangement, in the formula, the case was described in which openings 16, 17 are spaced apart in the drawing.

In this arrangement, l is the length of opening 15. Accordingly, distance d between openings 16, 17 or length l of opening 15 is selected in such a way that opening 15 is only able to migrate back and forth between the particular right (opening 16) or left (opening 17) end when openings 16, 17 are aligned. The position of opening 15 is a function of the alignment of the masks with one another.

FIGS. 5A and 5B show a double Zener diode having three doped regions each. According to FIG. 5A, a doped region 2 and a doped region 21 are N+ doped. A P+ doped region 3 is situated between doped regions 2, 21. The shaping of doped regions 2, 21, 3 is selected according to FIG. 1 or according to FIG. 3. Each doped region 2, 3, 21 is provided with a contact surface 21. Furthermore, terminal leads 19 to the double Zener diode are suggested, according to which a parallel circuit of the left Zener diode (formed by PN junction 41) and the right Zener diode (formed by PN junction 42) is provided.

In contrast to FIG. 5a, only the dopings are exchanged according to FIG. 5B. The N+ doped region 2 is situated between P+ doped regions 3, 31.

FIG. 6 shows a Zener diode circuit having a Zener diode 8, which is connected to a device for impressing a current into Zener diode 9, 12. To that end, a programmable transistor 9 is connected to Zener diode 8. A control logic 12 is connected to programming transistor 9. Control logic 12 determines if programming transistor 9 is to become conductive. If this is the case, a high current flows through Zener diode 8, which shorts Zener diode 8 and shifts the Zener diode into the programmable condition. The programming state of Zener diode 8 may be read out using a comparator 10 in conjunction with a pull-up resistor 11. In addition, a contact surface 13 is provided, via which additional electrical or electronic modules or components may be connected to Zener diode 8, or to which the required programming voltage may be fed.

A typical switching voltage applied to the Zener diode is between 3 and 5 volts.

The programming current required to short the Zener diode is typically 100 mA, the read-out current 50 μA. The programming voltage required is a function of the size of the programming transistor; however, it is typically between 5 and 8 volts.

The examples described herein are not limited to PROM components, but instead may be generally applied to any form of Zener diode or PN junction.

What is claimed is:

1. A zener diode comprising:
    a semiconductor substrate comprising an N-doped region and a P-doped region that form a PN junction, the N-doped region and the P-doped region either being adjacent to each other or partially overlapping each other at the PN junction, the N-doped region and the P-doped region having areas with widths that decrease at least until the N-doped region and the P-doped region reach the PN junction;
    wherein the PN junction is in an area where the width of the N-doped region decreases and in an area where the width of the P-doped region decreases.

2. The zener diode of claim 1, wherein the N-doped region has a first straight edge and the P-doped region has a second straight edge, the first straight edge facing the second straight edge.

3. The zener diode of claim 1, further comprising:
    an additional P-doped region, the N-doped region being between the P-doped region and the additional P-doped region, the N-doped region forming a second PN junction with the additional P-doped region.

4. The zener diode of claim 1, further comprising:
    an additional N-doped region, the P-doped region being between the N-doped region and the additional N-doped region, the P-doped region forming a second PN junction with the additional N-doped region.

5. The zener diode of claim 1, wherein the N-doped region and the P-doped region are formed via an opening of a diffusion mask.

6. The zener diode of claim 1, wherein the N-doped region and the P-doped region are symmetric relative to a plane that is perpendicular to a surface of the semiconductor substrate.

7. The zener diode of claim 1, wherein the N-doped region is N+ doped and the P-doped region is P+ doped.

8. The zener diode of claim 1, wherein the N-doped region and the P-doped region overlap at the PN junction.

9. The zener diode of claim 1, wherein the N-doped region and the P-doped region are produced using photolithographic masks; and
wherein the N-doped region and the P-doped region have a minimum width at the PN junction, the minimum width corresponding to a maximum expected alignment error of the photolithographic masks.

10. The zener diode of claim 1, wherein the N-doped region and the P-doped region are produced using photolithographic masks;
wherein the zener diode further comprises at least one of an additional N-doped region and an additional P-doped region, the additional N-doped region and the additional P-doped region being produced using the photolithographic masks; and
wherein a distance between two regions having a same type of doping corresponds to an expected alignment error of the photolithographic masks.

11. A zener diode circuit, comprising:
a zener diode comprising a semiconductor substrate that comprises an N-doped region and a P-doped region that form a PN junction, the N-doped region and the P-doped region either being adjacent to each other or partially overlapping each other at the PN junction, the N-doped region and the P-doped region having areas with widths that decrease at least until the N-doped region and the P-doped region reach the PN junction, wherein the PN junction is in an area where the width of the N-doped region decreases and in an area where the width of the P-doped region decreases;
a transistor that provides current to the zener diode; and
circuitry that detects a state of the zener diode.

12. A method for manufacturing a zener diode, comprising:
producing a first mask on a semiconductor substrate via photolithography;
aligning a second mask to the first mask; and
producing the second mask on the semiconductor substrate via photolithography;
wherein the first mask and the second mask have respective first and second openings on a surface of the semiconductor substrate, the first and second openings having adjacent areas with widths that decrease to a minimum width, the minimum width corresponding to a maximum expected alignment error of the first and second masks; and
wherein the semiconductor substrate is N+ or P+ doped at the first opening, and the semiconductor substrate is N+ or P+ doped at the second opening such that a doping at the second opening is different from a doping at the first opening to form a PN junction;
wherein a width of an N-doped region resulting from doping and a width of a P-doped region resulting from doping decrease at least until the width of the N-doped region and the width of the P-doped region reach the PN junction; and wherein the PN junction is in an area where the width of the N-doped region decreases and in an area where the width of the P-doped region decreases.

13. A method for manufacturing a zener diode, comprising:
producing a first mask on a semiconductor substrate via photolithography;
aligning a second mask to the first mask; and
producing the second mask on the semiconductor substrate via photolithography;
wherein the first mask has a first opening and the second mask has second and third openings on a surface of the semiconductor substrate, the first opening being between the second and third openings, the first and second openings having adjacent areas with widths that decrease to a minimum width, and the first and third openings having adjacent areas with widths that decrease to the minimum width, the minimum width corresponding to a maximum expected alignment error of the first and second masks;
wherein the semiconductor substrate is N+ or P+ doped at the first opening to form a first PN junction, and the semiconductor substrate is N+ or P+ doped at the second and third openings to form a second PN junction, wherein a doping at the second and third openings is different from a doping at the first opening;
wherein the first PN junction is in an area where a width of a first N-doped region decreases and in an area where a width of a first P-doped region decreases;
wherein the second PN junction is in an area where a width of a second N-doped region decreases and in an area where a width of a second P-doped region decreases;
wherein the width of the first N-doped region and the width of the first P-doped region decrease at least until the width of the first N-doped region and the width of the first P-doped region reach the first PN junction; and
wherein the width of the second N-doped region and the width of the second P-doped region decrease at least until the width of the second N-doped region and the width of the second P-doped region reach the second PN junction.

14. The method of claim 13, wherein a distance between the second and third openings corresponds to a maximum expected alignment error of the first and second masks.

15. The zener diode circuit of claim 11, further comprising:
control logic that controls the transistor to provide the current to the zener diode, the control logic determining whether the transistor is to conduct and controlling the transistor accordingly.

16. The zener diode circuit of claim 11, wherein the circuitry comprises:
a comparator connected to a first terminal of the zener diode; and
a pull-up resistor connected to a second terminal of the zener diode.

17. A zener diode comprising:
an N-doped region comprised of an area having a substantially trapezoidal shape with a first top that is smaller than a first base; and
a P-doped region comprised of an area having a substantially trapezoidal shape with a second top that is smaller than a second base, the first top and the second top overlapping to form a PN junction;
wherein the PN junction is in an area where the width of the N-doped region decreases and in an area where the width of the P-doped region decreases; and
wherein the width of the N-doped region and the width of the P-doped region decrease at least until the width of the N-doped region and the width of the P-doped region reach the PN junction.

18. The zener diode of claim 17, further comprising:
a second N-doped region comprised of an area having a substantially trapezoidal shape with a third top that is smaller than a third base;
wherein the P-doped region is between the N-doped region and the second N-doped region, and the P-doped region comprises a second area having a substantially trapezoidal shape with a fourth top that is smaller than a fourth base; and wherein the third top and the fourth top overlap to form a second PN junction.

19. The zener diode of claim 17, further comprising:

a second P-doped region comprised of an area having a substantially trapezoidal shape with a third top that is smaller than a third base;

wherein the N-doped region is between the P-doped region and the second P-doped region, and the N-doped region comprises a second area having a substantially trapezoidal shape with a fourth top that is smaller than a fourth base; and wherein the third top and the fourth top overlap to form a second PN junction.

20. A zener diode comprising:

a semiconductor substrate comprising an N-doped region and a P-doped region that form a PN junction, the N-doped region and the P-doped region either being adjacent to each other or partially overlapping each other at the PN junction, the N-doped region and the P-doped region both having areas with widths that decrease at least until the N-doped region and the P-doped region reach the PN junction, the PN junction being in an area where the width of the N-doped region decreases and in an area where the width of the P-doped region decreases; and an additional P-doped region, the N-doped region being between the P-doped region and the additional P-doped region, the N-doped region forming a second PN junction with the additional P-doped region, the N-doped region and the additional P-doped region either being adjacent to each other or partially overlapping each other at the second PN junction, the N-doped region and the additional P-doped region both having areas with widths that decrease at least until the N-doped region and the additional P-doped region reach the second PN junction; the second PN junction being in an area where the width of the N-doped region decreases and in an area where the width of the additional P-doped region decreases.

21. A zener diode comprising:

a semiconductor substrate comprising an N-doped region and a P-doped region that form a PN junction, the N-doped region and the P-doped region either being adjacent to each other or partially overlapping each other at the PN junction, the N-doped region and the P-doped region both having areas with widths that decrease at least until the N-doped region and the P-doped region reach the PN junction, the PN junction being in an area where the width of the N-doped region decreases and in an area where the width of the P-doped region decreases; and an additional N-doped region, the P-doped region being between the N-doped region and the additional N-doped region, the P-doped region forming a second PN junction with the additional N-doped region, the additional N-doped region and the P-doped region either being adjacent to each other or partially overlapping each other at the second PN junction, the additional N-doped region and the P-doped region both having areas with widths that decrease at least until the additional N-doped region and the P-doped region reach the second PN junction, the second PN junction being in an area where the width of the additional N-doped region decreases and in an area where the width of the P-doped region decreases.

* * * * *